United States Patent [19]

Newcomb et al.

[11] Patent Number: 4,668,936
[45] Date of Patent: May 26, 1987

[54] UNTRIMMED 12 BIT MONOTONIC ALL CAPACITIVE A TO D CONVERTER

[75] Inventors: Russell R. Newcomb, Fullerton, Calif.; William C. Black, Cedar Rapids, Iowa

[73] Assignee: Hughes Aircraft Company, Los Angeles, Calif.

[21] Appl. No.: 787,831

[22] Filed: Oct. 15, 1985

[51] Int. Cl.⁴ ............................................. H03M 1/38
[52] U.S. Cl. ............................................. 340/347 AD
[58] Field of Search ................ 340/347 AD, 347 DA, 340/347 NT, 347 C; 324/99 D

[56] References Cited

U.S. PATENT DOCUMENTS

| | | | |
|---|---|---|---|
| 3,251,052 | 5/1966 | Hoffman | 340/347 AD |
| 4,195,282 | 3/1980 | Cameron | 340/347 AD |
| 4,380,756 | 4/1983 | Worsman | 340/347 AD |
| 4,531,113 | 7/1985 | Abraham | 340/347 AD |

*Primary Examiner*—Charles D. Miller
*Attorney, Agent, or Firm*—Robert Thompson; A. W. Karambelas

[57] ABSTRACT

An M-bit all-capacitive analog-to-digital (A/D) converter is disclosed which includes $2^N$ switched capacitors of substantially identical capacitance for use in determining the N most significant bits. Each of the capacitors have one terminal connected to a common node and its other terminal switchable to either ground or a positive reference voltage. At the beginning of a conversion cycle, the common node is at a potential indicative of a sampled analog input voltage, a first group of $2^{N-1}$ capacitors are switched to ground, and a second group of $2^{N-1}$ capacitors are switched to the positive reference voltage. For a given conversion cycle, selected capacitors of one of the capacitor groups are sequentially switched to drive the common node voltage to ground. A method is also disclosed for converting analog signals to digital signals utilizing parallel capacitive elements of substantially identical capacitance.

14 Claims, 9 Drawing Figures

UNTRIMMED 12 BIT MONOTONIC ALL CAPACITIVE A TO D CONVERTER

BACKGROUND OF THE INVENTION

The disclosed invention generally relates to all capacitive analog-to-digital (A/D) converters, and is particularly directed to an all capacitive A/D converter which utilizes selectively switched parallel capacitors of substantially identical value.

Analog-to-digital (A/D) converters are utilized in systems wherein analog signals, such as those provided by analog transducers, are processed digitally. The resolution of a particular A/D converter increases with the number of output bits, and the resolution will depend upon the required dynamic range of the particular application.

While the need for accurate high resolution A/D converters has existed for some time, the attempts to meet such needs have not been satisfactory. With known A/D converter techniques which utilize binary weighted elements, maintaining monotonicity with increased resolution becomes more difficult. Particularly, as the number of bits increases the requirement of matching circuit elements quickly becomes more stringent. An example of the use of binary weighted elements is set forth in U.S. Pat. No. 4,129,863, issued to Gray, et al. on Dec. 12, 1978, which utilizes binary weighted capacitors.

With monolithic integrated circuitry the stringent matching requirement may be addressed by increasing the dimensions of precision ratioed elements to reduce mismatching. However, increasing element dimensions reduces yield.

Another approach to meeting the stringent matching requirement is the use of precision thin film precision resistors and on-chip laser trimming. However, besides being more complex, laser trimming may affect the temperature tracking characteristics of the resistors.

A particular approach to dealing with the matching requirement is set forth in a paper "High-Resolution A/D Conversion in MOS/LSI," *IEE Journal of Solid State physics*, Fotouhi et al, Vol. SC-14, No. 6, Dec. 1979, pp. 920–926. The technique disclosed therein combines a string of equal valued diffused resistors and a binary ratioed capacitor array to achieve 12 bit monotonicity while requiring 8 bit ratio accurate circuit elements. However, the matching of resistors is usually more complex than the matching of capacitors. A similar technique is set forth in U.S. Pat. No. 4,200,863, issued to Hodges, et al. on Apr. 29, 1980.

Another particular approach is set forth in a paper "A Monolithic 12b 3us ADC," McGlinchey, 1982 IEEE International Solid-State Circuits Conference, Digest of Technical Papers, pp. 80–81. The technique disclosed therein utilizes parallel equal valued current sources for the most significant bits. However, such technique is necessarily more complex because of the use of active devices.

Yet another known approach involves the use of parallel equal valued resistors for the most significant bits. However, matching resistors is usually more difficult than matching capacitors.

SUMMARY OF THE INVENTION

It would therefore be an advantage to provide a high resolution analog-to-digital converter which has reduced element matching requirements.

Another advantage would be to provide a high resolution analog-to-digital converter which does not require laser trimming to achieve high resolution.

Still another advantage would be to provide a high resolution analog-to-digital converter which utilizes selectively switched parallel capacitive elements of substantially identical value.

It would also be an advantage to provide a high resolution M-bit analog-to-digital converter wherein the top N bits are processed with selectively switched parallel capacitive elements of substantially identical value with a capacitor matching requirement of one part in $2^{M-N}$ to have no missing codes.

A further advantage would be to provide a high resolution analog-to-digital converter which utilizes all capacitive elements and has reduced element matching requirements.

The foregoing and other advantages and features are provided in the invention which includes an analog-to-digital converter having $2^N$ switched capacitors of substantially identical value which are utilized to determine the N most significant bits (MSB's). Each of the switched capacitors has one terminal coupled to a common node while the other terminal is selectively switchable to ground or to a positive reference voltage. At the beginning of a conversion cycle, the switchable terminals of a first group of $2^{N-1}$ capacitors are connected to ground while the switchable terminals of a second group of $2^{N-1}$ capacitors are connected to the positive reference voltage. The common node is then charged to a potential indicative of the sampled analog input voltage. Pursuant to the initial polarity of the common node voltage, one of the first or second capacitor groups is selected for selective switching of its capacitors. The capacitors of the selected capacitor group are switched in a sequence which is adapted to force the common node potential closer and closer to ground. The MSB digital outputs are defined by the respective polarities of the common node potential at the initial state prior to any switching and after subsequent switchings.

The invention further includes a method for converting an analog signal to a digital signal which includes the steps of (1) coupling the first terminals of $2^N$ capacitors of substantially equal value to a common node, and switchably coupling respective second terminals of such capacitors to either a first reference voltage node or a second reference voltage node (2) sampling the analog input voltage to provide a voltage on the common node indicative of the sampled analog input voltage; (3) controlling the connections of respective second terminals of the capacitors to provide a first capacitance between the common node and the first reference voltage node, and to provide a second capacitance between the common node and the second reference voltage node; and (4) sequentially changing the first and second capacitances to incrementally drive the voltages of the common node toward said first reference and to provide an output bit pursuant to each successive of the first and second capacitances.

BRIEF DESCRIPTION OF THE DRAWING

The advantages and features of the disclosed invention will readily be appreciated by persons skilled in the art from the following detailed description when read in conjunction with the accompanying drawing wherein.

DETAILED DESCRIPTION

In the following detailed description and in the several figures of the drawing, like elements are identified with like reference numerals.

Figure 1:
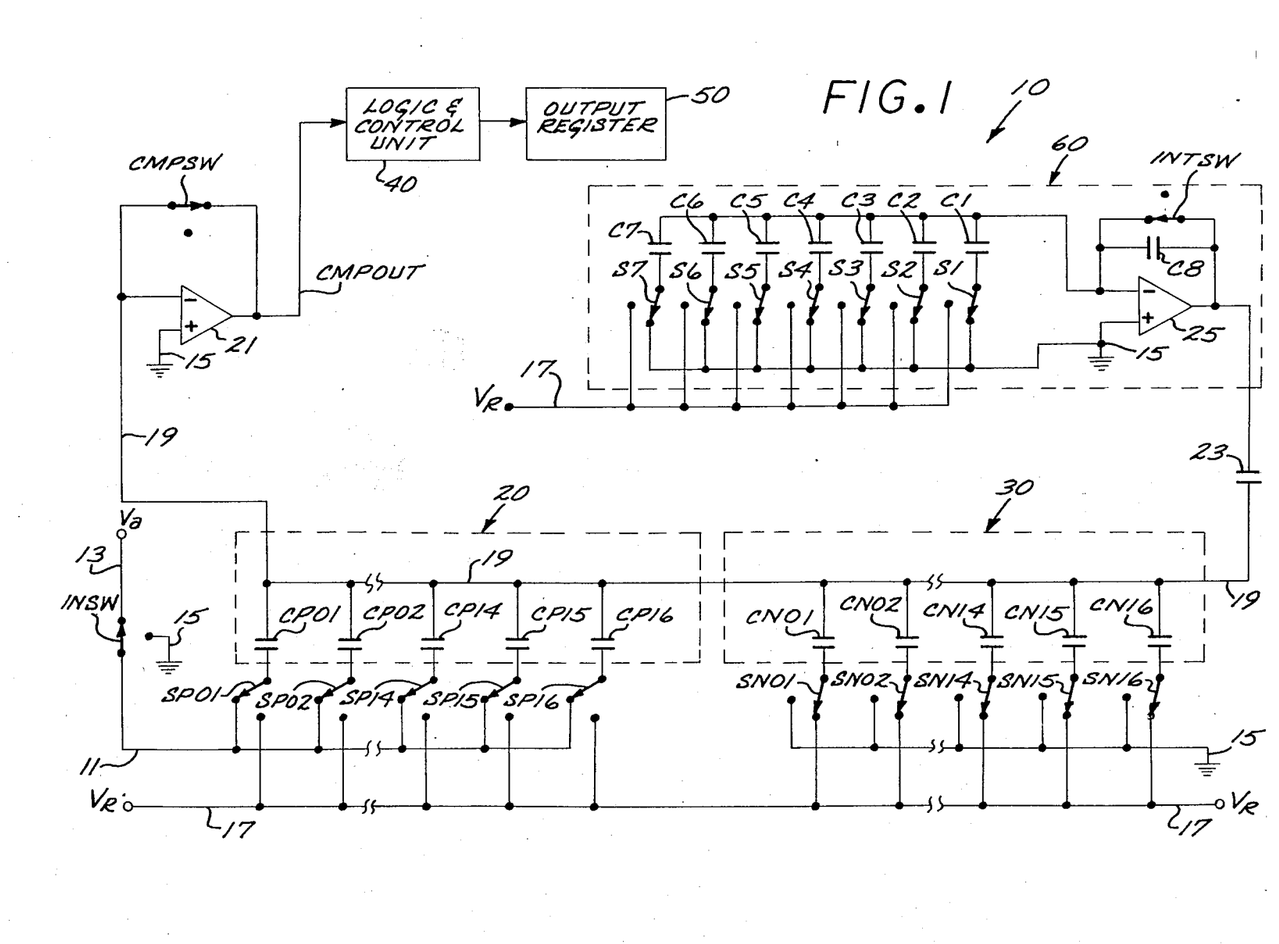
FIG. 1 is a schematic diagram of the disclosed analog-to-digital (A/D) converter.

Referring now to FIG. 1, shown therein is an analog-to-digital (A/D) converter 10 for providing a 12-bit output (including sign bit), and includes an input line 11 which is connected to an input switch INSW. The input switch INSW may be selectively switched between an analog input node 13 and a ground reference node 15. The analog input voltage $V_A$ to be converted appears at the analog input node 13. In the initial state prior to conversion, the switch INSW is coupled to the analog input node 13 and therefore the input line 11 is coupled to the analog input voltage $V_A$. When the input switch INSW is switched from the initial state to the ground reference node 15, the analog input voltage $V_A$ is effectively sampled.

The A/D converter 10 further includes a first capacitor group 20 and a second capacitor group 30 which are utilized in determining the five most significant bits (MSB's) of the 12-bit output. The capacitors are of substantially identical value C, and the total number of capacitors of both groups is $2^N$, where N is the number of MSB's to be defined by the capacitor groups 20, 30. Each capacitor group includes one-half of the $2^N$ capacitors, namely $2^{N-1}$ capacitors. In the disclosed example, five MSB's (identified as MSB1 through MSB5) including the sign bit are defined by the capacitor groups 20, 30 which therefore include a total of thirty-two capacitors.

The first capacitor group 20 includes sixteen capacitors CP01 through CP16 which are connected to a common node 19. The capacitors CP01 through CP16 are further respectively coupled to respective switches SP01 through SP16 which may be selectively switched between the input line 11 and a positive reference node 17 which is at a reference voltage $V_R$. In the initial state prior to conversion, the switches SP01 through SP16 are coupled to the input line 11, and therefore the capacitors CP01 through CP16 are respectively coupled to the input line 11.

The second capacitor group 30 includes sixteen capacitors CN01 through CN16 which are connected to the common node 19. The capacitors CN01 through CN16 are further respectively coupled to respective switches SN01 through SN16 which may be selectively switched between the ground reference node 15 and the positive reference node 17. In the initial state prior to conversion, the switches SN01 through SN16 are coupled to the positive reference node 17, and therefore the capacitors CN01 through CN16 are respectively coupled to the positive reference node 17.

The common node 19 is connected to the inverting input of a voltage comparator 21 which has its non-inverting input connected to the ground reference node 15. The inverting input of the comparator 21 is further connected to a switch CMPSW which may be selectively switched between an open position and the output of the comparator 21 which provides a CMPOUT signal. In the initial state prior to conversion, the switch CMPSW is switched to the output of the comparator 21 to force the common node 19 to ground.

The CMPOUT output of the comparator 21 is coupled to a logic and control unit 40 which provides the necessary logic and control functions for the A/D converter 10 and serially provides the digital output of the A/D converter to an output register 50.

The A/D converter 10 further includes a digital-to-analog (D/A) converter 60 of standard successive approximation configuration which is utilized for determining the seven least significant bits (LSB's). The D/A converter 60 is coupled to the common node 19 via a capacitor 23 that is of substantially the same value as each of the capacitors in the capacitor groups 20, 30. The D/A converter 60 includes seven binary weighted capacitors C1 through C7 which are commonly connected to the inverting input of an operational amplifier 25. The non-inverting input of the operational amplifier 25 is connected to the ground reference node 15. The capacitors C1 through C7 are further coupled to switches S1 through S7 which may be selectively switched to the ground reference node 15 or to the positive reference node 17. In the initial state prior to conversion, the switches S1 through S7 are switched to the ground reference node 15, and therefore the capacitors C1 through C7 are coupled to ground.

The capacitors C1 through C7 are binary weighted wherein the capacitor C1 has a base value CAP, the capacitor C2 has a value of, 2CAP, the capacitor C3 has a value of 4CAP, and so forth to the capacitor C7 which has value of 64CAP.

The output of the operational amplifier 25 is coupled via a capacitor C8 to its inverting input. The capacitor C8 has a value of 128CAP, where CAP is the value of the capacitor C1. A switch INTSW is in parallel with the capacitor C8 and can be switched between an open and closed position. In the initial state, the switch INTSW is in the closed position whereby it provides a short circuit between the output of the operational amplifier 25 and its inverting input. With the switch INTSW closed, the output of the operational amplifier 25 is at ground.

In operation, the above-described switch elements of the A/D converter 10 and controlled by the logic and control unit 40 to be in their initial states at the time the analog input signal $V_A$ to be converted is at the analog input node 13. The following Table I summarizes the initial states of the switches:

TABLE I

| SWITCH | POSITION |
|---|---|
| INTSW | closed |
| CMPSW | closed |
| INSW | $V_A$ |
| SPXX | $V_A$ |

TABLE I-continued

| SWITCH | POSITION |
|---|---|
| SNXX | $V_R$ |
| SX | ground |

Figure 2:
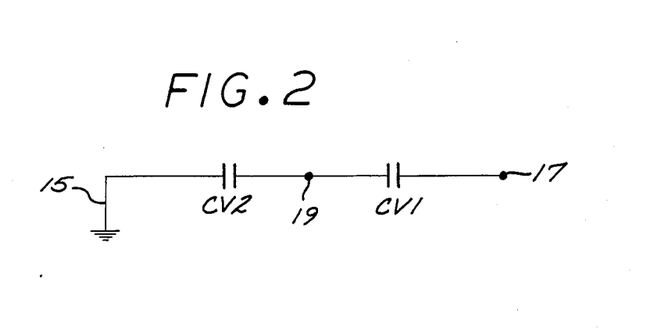
FIG. 2 is a schematic diagram of the capacitor groups of the A/D converter of FIG. 1.
Figure 3A:
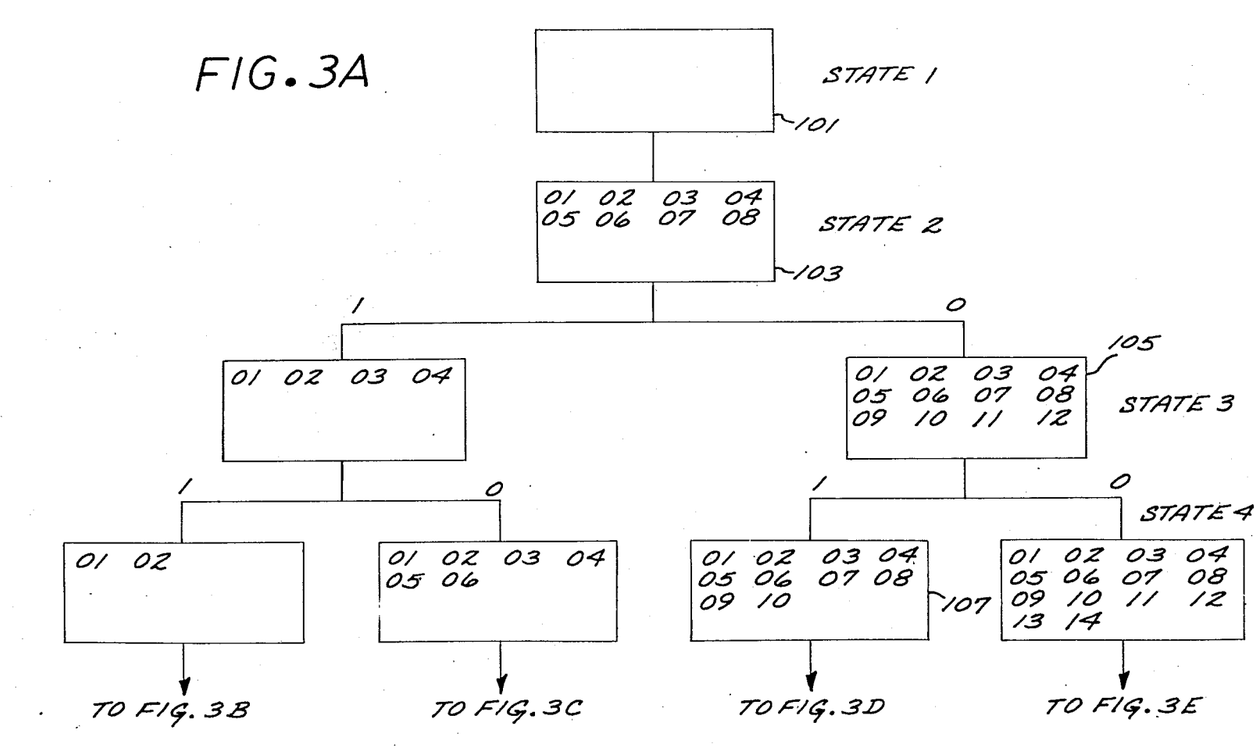
FIG. 3 is a state diagram showing the possible switched states of the parallel capacitors of the A/D converter of FIG. 1.
Figure 3B:
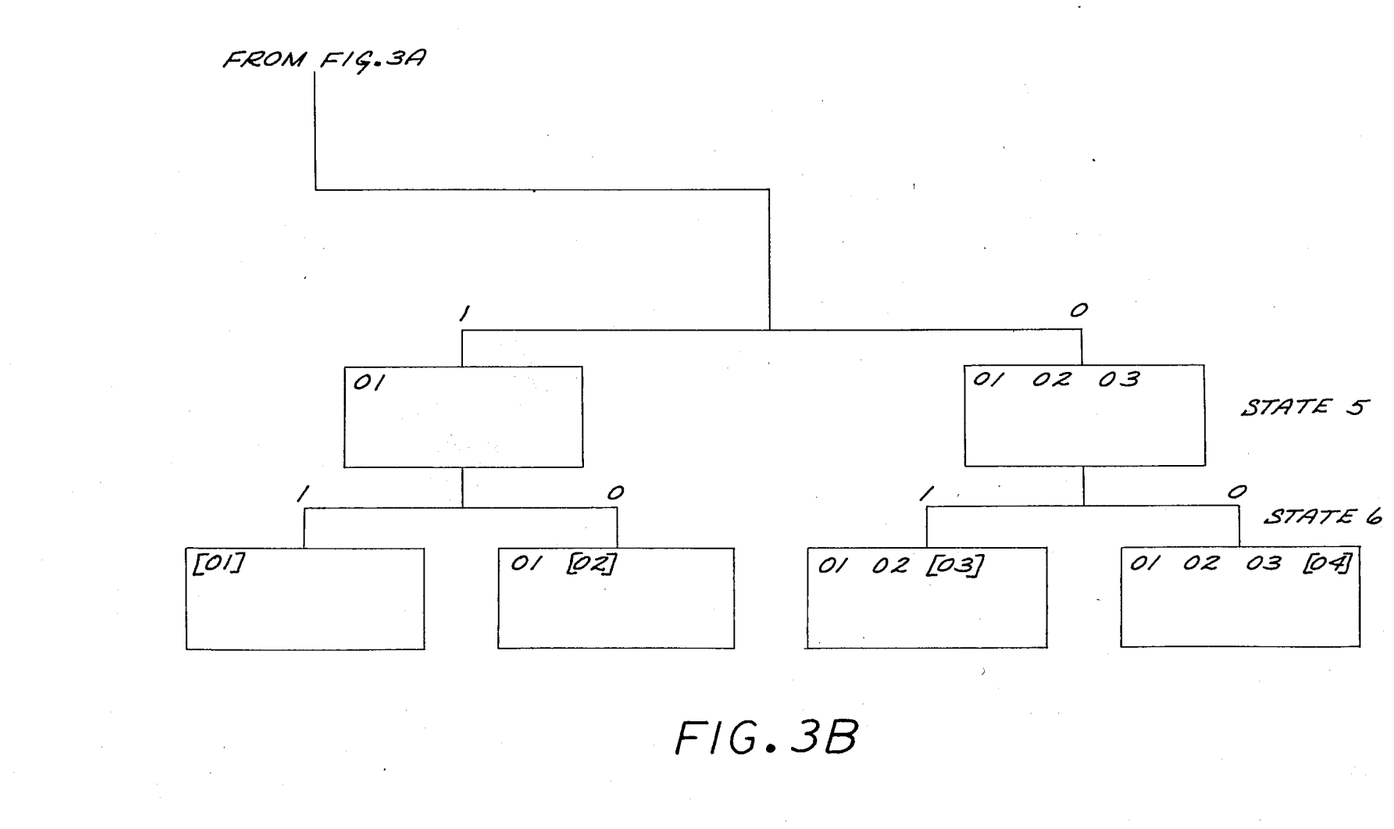
Figure 3C:
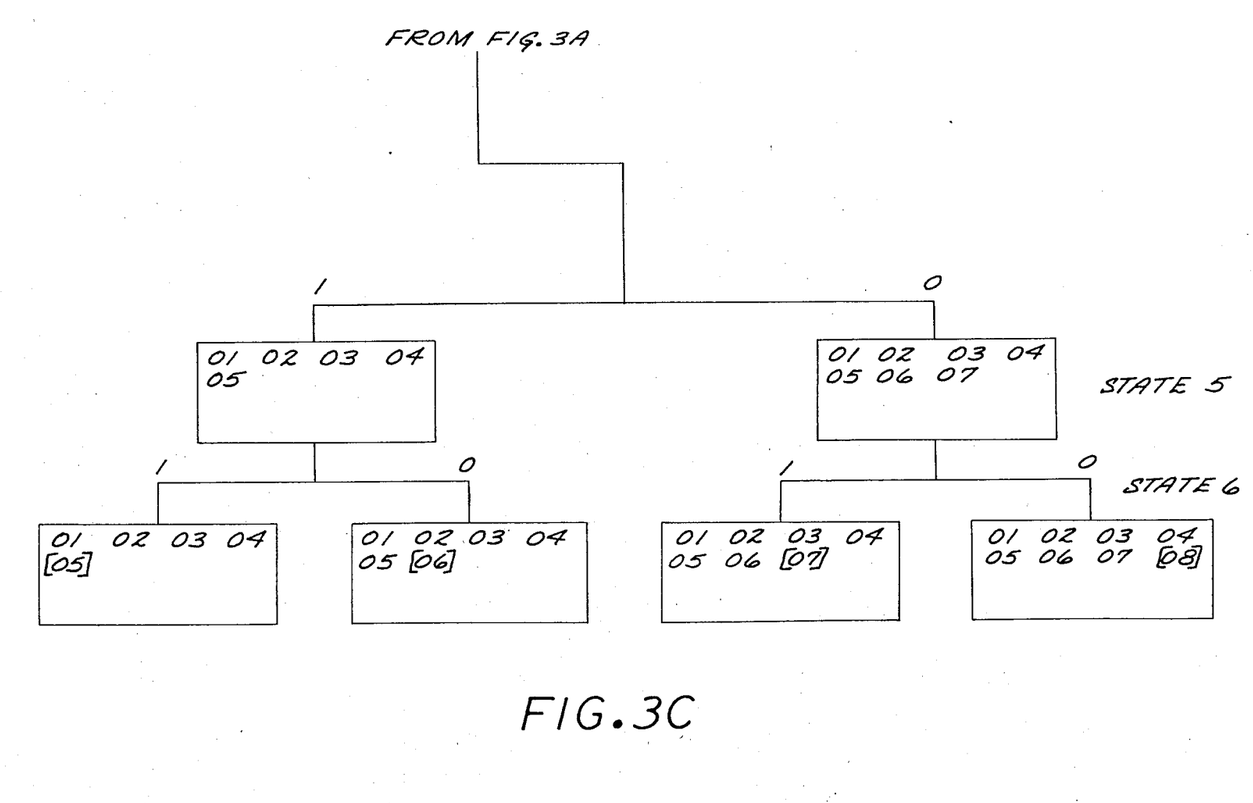
Figure 3D:
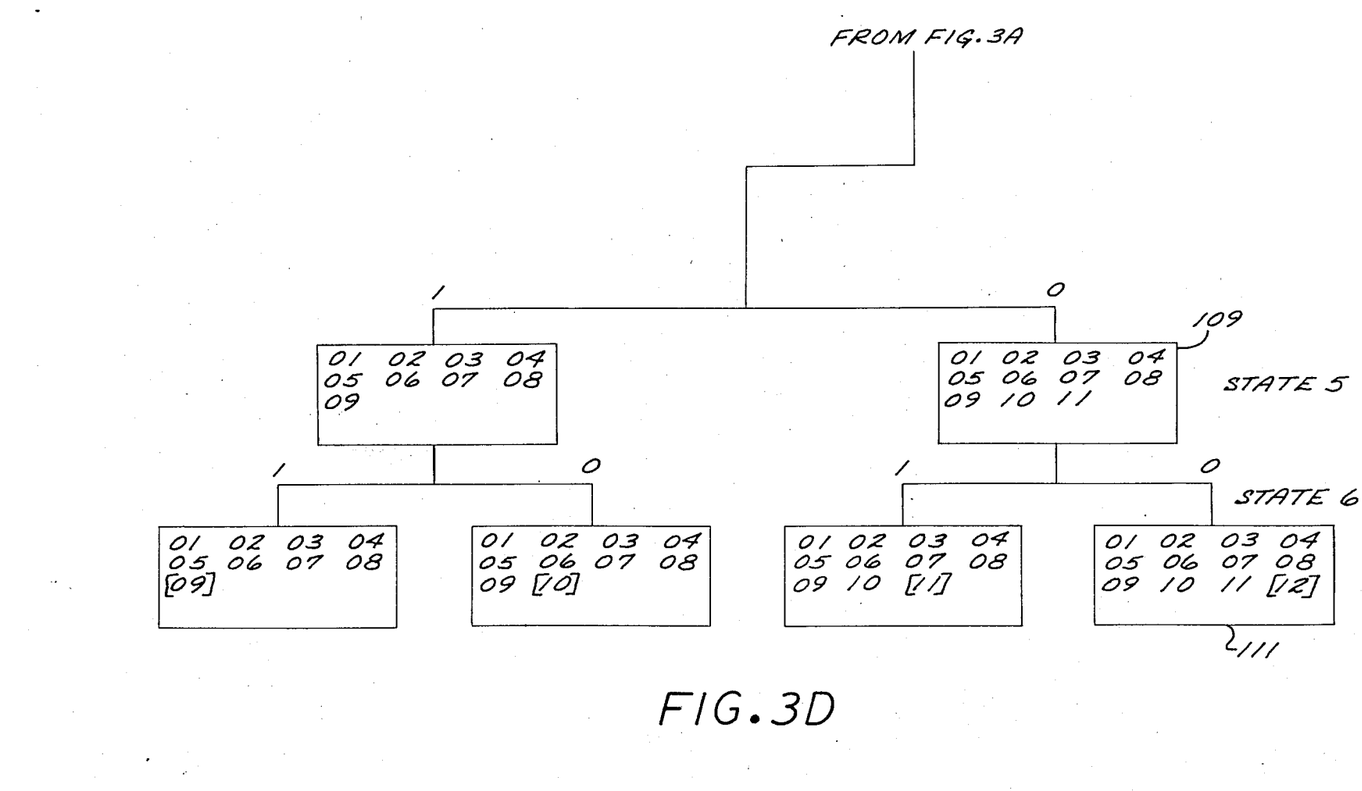
Figure 3E:
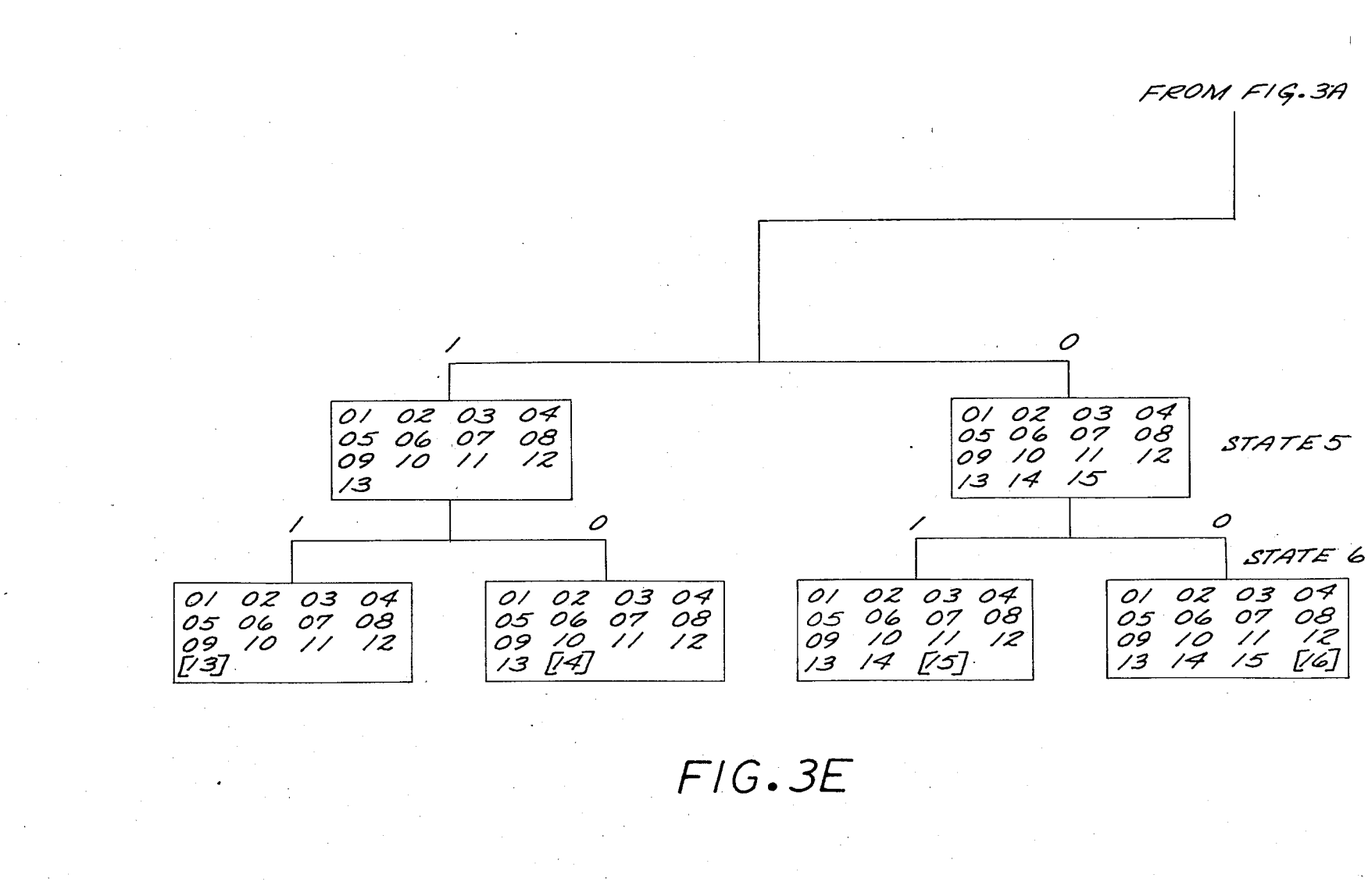

In order to more readily understand the effects of the switches associated with the capacitor groups 20, 30, reference is made to FIG. 2 which schematically shows the capacitances provided by the capacitor groups 20, 30. CV1 represents the capacitance between the common node 19 and the positive reference node 17, while CV2 represents the capacitance between the common node 19 and the ground reference node 15. With the switches associated with the capacitor groups 20, 30 in their initial positions, CV1 corresponds to capacitance provided by the capacitors CN01 through CN16, and CV2 corresponds to capacitance provided by the capacitors CP01 through CP16. The values of the capacitances of CV1 and CV2 are controlled by the switches SN01 through SN16 and the switches SP01 through SP16.

For reference purposes, each capacitor of each capacitor group shall be considered as being "removed" or "out" when its associated switch is in the initial state. A capacitor shall be considered "added" or "in" when its associated switch is in the non-initial or alternate position. Thus, capacitors of the capacitor group 20 are added or removed in parallel relative to the capacitors of the other capacitor group 30, or vice versa. In doing so, the change in the values of the capacitances CV1 and CV2 are equal and opposite.

As will be discussed more fully herein, for a given conversion cycle, capacitors of only one of the capacitor groups 20, 30 are selectively added or removed to sequentially drive the common node voltage toward ground reference. However, as discussed above, such switching changes both capacitances CV1 and CV2. An output bit is determined pursuant to each successive state of the capacitances CV1 and CV2 as controlled by switches associated with one of the capacitor groups 20, 30.

When the switches associated with the appropriate capacitor group are in the positions to allow for determination of one of the five MSB's, the capacitor groups 20, 30 are considered to be in STATE1 for determination of the first most significant bit MSB1, STATE2 for determination of the second most significant bit MSB2, and so forth.

At the beginning of a conversion cycle, the switch INTSW is opened and the switch CMPSW is subsequently opened. Then the input switch INSW is switched to ground to effectively sample-and-hold the analog input voltage $V_A$. It should be noted that prior to switching the input switch INSW to ground, the common node 19 is at ground potential as a result of the switch CMPSW having been initially closed.

The switching of the input switch INSW to ground causes the voltage on the input line 11 to change by an amount equal to the sampled analog input voltage $V_A$ so that it is at the ground reference. The voltage $V_C$ of the common node 19 changes by an amount equal to one-half the magnitude of the sampled analog input voltage $V_A$ since the capacitor groups 20, 30 function as a fifty percent voltage divider. The change in the common node voltage $V_C$ is in the negative direction when the sampled analog input voltage $V_A$ is positive, and is in the positive direction when the sampled analog input voltage is negative. Since the common node voltage $V_C$ is initially at the ground reference, a positive sampled analog input voltage $V_A$ will result in a common node voltage $V_C$ which is negative, while a negative sampled analog input voltage $V_A$ will result in a common node voltage $V_C$ which is positive. Thus, switching INSW to ground effectively causes a sampled voltage to appear on the common node 19, wherein such sampled voltage is $-\frac{1}{2}V_A$.

Pursuant to the sampling of the input analog voltage $V_A$, the five most significant bits MSB1 through MSB5 are serially determined by successive approximation wherein the common node voltage $V_C$ is incrementally driven towards the ground reference by sequentially changing the values of the capacitances CV1 and CV2. As discussed relative to FIG. 2, the values of the capacitances CV1 and CV2 change in equal and opposite directions pursuant to switching of the switches associated with the capacitor groups 20, 30. Specifically, the values of the capacitances CV1 and CV2 are changed by adding or removing in binary weighted groups capacitors of one of the capacitor groups 20, 30. The switching for accomplishing such removal and/or addition is controlled by the logic and control unit 40 which particularly controls the conversion cycle as follows.

Upon the sampling of the input analog voltage $V_A$, the polarity of the common node voltage $V_C$ during STATE1 is utilized to determine the capacitor group whose capacitors will be sequentially added or removed, and also to define MSB1. The polarity of the common node voltage $V_C$ is indicated by the CMPOUT output of the voltage capacitor 21. CMPOUT is high when $V_C$ is negative, and is low when $V_C$ is positive.

Specifically, the capacitors of the first capacitor group 20 will be switched in the course of conversion when the common node voltage $V_C$ is initially negative pursuant to a positive sampled analog input voltage $V_A$. The capacitors of the second capacitor group 30 will be switched in the course of conversion when $V_C$ is initially positive pursuant to a negative sampled input analog voltage $V_A$.

As to MSB1, if the common node voltage $V_C$ is positive, then MSB1 is 1. If $V_C$ is negative, then MSB1 is 0.

The CMPOUT output of the voltage comparator 21 is the complement of MSB1, and therefore the output provided by the comparator 21 for MSB1 is complemented by the logic and control unit 40 which transfers the appropriate value for MSB1 to the output register 50.

For determination of MSB2 through MSB5, the logic and control unit 40 specifically controls whether capacitance is added or removed on the basis of the result of an exclusive OR operation on the CMPOUT output of the comparator 21 and the negated value of MSB1 identified as MSB1'. Such operation is defined as follows:

$$A = \text{CMPOUT} \oplus \text{MSB1}' \qquad \text{(Equation 1)}$$

If the exclusive OR result A is 0 (low), then capacitors need to be added by switching associated switches from their initial positions. If the exclusive OR result A is 1 (high), then capacitors need to be removed by switching associated switches from their alternate positions.

The determination of which particular capacitors are added or removed is based on the following rules. Capacitance is added from capacitance that was most recently removed, if any. Otherwise, capacitance is added from capacitance which had not been previously added or removed. Capacitance is removed from capacitance that was most recently added.

Also, for MSB1, no capacitors are switched from their initial state. For MSB2, one-half of the capacitors of the selected capacitor group are switched. For MSB3, one-fourth of the capacitors of the selected capacitor group are switched. For MSB4, one-eighth of selected group capacitors are switched, and for MSB5, one-sixteenth of such group are switched. Thus, for the determination of N MSB's, each capacitor group has $2^{N-1}$ capacitors and the subgroups that are switched respectively have the following number of capacitors:

$$K_I = 0 \text{ for } I = 1 \quad \text{(Equation 2)}$$

$$K_I = (2^{N-1}) * (2^{I-1})^{-1} \text{ for } I \rightarrow 2 \quad \text{(Equation 3)}$$

where $K_I$ represents the number of capacitors that need to be switched for determination of the $I^{th}$ MSB, where I equals 1 through N. Equation 3 can be simplified to the following:

$$K_I = 2^{N-I} \text{ for } I \geq 2 \quad \text{(Equation 4)}$$

Stated another way, for MSB2, one-half of the capacitors of the selected capacitor group are switched, and for subsequent MSB's the number of capacitors to be switched is one-half of the number of capacitors switched for the immediately preceding MSB.

By sequentially adding or removing capacitance as a function of the exclusive OR result A, the common node voltage $V_C$ is incrementally driven toward the ground reference potential. Pursuant to each addition or removal of capacitance, the polarity of the common node voltage is utilized to provide an output bit for one of the most significant bits.

As mentioned previously, for MSB1, CMPOUT is complemented and provided to the output register 50. For MSB2 through MSB5, the value of CMPOUT is directly provided to the output register 50. As will be discussed more fully below, for the seven least significant bits, identified as MSB6 through MSB12, CMPOUT is complemented and provided to the output register 50.

The foregoing described sequential switching of capacitors is exemplified in the state diagram of FIG. 3 which shows the capacitors of the selected capacitor group that are switched from their initial state. FIG. 3 identifies only capacitors of the selected group since the capacitors of the other capacitor group remain in their initial state. For example, a block containing the following would indicate that the capacitors 01 through 14 of the selected group are switched to their alternate states:

01 02 03 04 05 06 07 08 09 10 11 12 13 14

The numerals in the blocks of FIG. 3 correspond to the numerical portion of the reference designations for the capacitors of the selected capacitor group 20, 30.

The particular path traced through the state diagram of FIG. 3 will depend upon the result A of the exclusive OR operation of Equation 1 at each STATE. The different branches of FIG. 3 are identified by either a 1 or a 0, to indicate which branch is to be followed depending on the result A of the exclusive OR operation of Equation 1 for the immediately preceding STATE.

Figure 4:
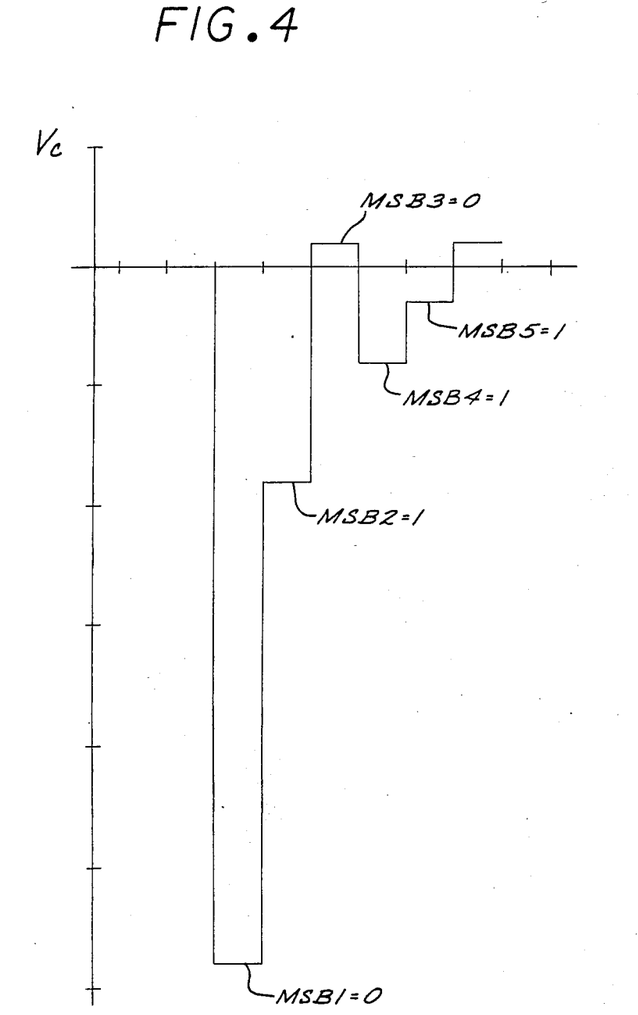
FIG. 4 is a graph illustrating for a particular analog input voltage the sampled voltage of the A/D converter of FIG. 1 as it changes in response to the selective switching of the parallel capacitors for determining the most significant bits.

An example discussed in conjunction with FIGS. 3 and 4 may be helpful. Assume the sampled analog input voltage $V_A$ is 0.725 $V_R$, where $V_R$ is the potential of the reference node 17. After the switch INSW is switched to ground, the the capacitor groups 20, 30 are in STATE1, and the common node voltage $V_C$ is negative. Therefore, MSB1 is 0, negated MSB1 is 1, and the first capacitor group 20 (CP01 through CP16) is determined to be the selected capacitor group. The exclusive OR result A of Equation 1 is a 0, and one-half of the unswitched capacitors, namely CP01 through CP08, are added by switching their associated switches from their initial positions as shown in the block 103. This places the capacitor groups 20, 30 in STATE2. The common node voltage $V_C$ is negative and therefore MSB2 is 1.

In STATE2, the exclusive OR result A of Equation 1 is a 0, and one-half of the remaining unswitched capacitors, namely CP09 through CP12, are added by switching their associated switches from their initial positions as shown in the block 105. This places the capacitor groups 20, 30 in STATE3. The common node voltage $V_C$ is positive and therefore MSB3 is 0.

In STATE3, the exclusive OR result A of Equation 1 is a 1, and one-half of the previously added capacitors, CP11 and CP12, are removed by switching their associated switches back to their initial positions as shown in the block 107. The common node voltage VC is negative and therefore MSB4 is 1. This places the capacitor groups 20, 30 in STATE4.

In STATE4, the exclusive OR result A of Equation 1 is a 0, and one-half of the previously removed capacitors, name CP11, is added by switching its associated switch SP11 to its alternate position as shown by the block 109. This places the capacitor groups 20, 30 in STATE5. The common node voltage $V_C$ is negative and therefore MSB5 is 1.

Thus, MSB1 through MSB5 have been determined for a particular example by incrementally driving the common node voltage $V_C$ toward the ground reference. In general, for a positive analog input voltage $V_A$, capacitance in the first capacitor group 20 is added (i.e., selected switches are switched to alternate positions) when the common node voltage $V_C$ is negative, while capacitance is removed (i.e., selected switches are switched to initial positions) when the common node voltage $V_C$ is positive. For a negative analog input voltage $V_A$, capacitance in the second capacitor group 30 is added (i.e., selected switches are switched to alternate positions) when the common node voltage $V_C$ is positive, while capacitance is removed (i.e., selected switches are switched to initial positions) when the common node voltage $V_C$ is negative.

After MSB1 (the sign bit) through MSB5 have been determined, the remaining voltage $V_C$ on the common node 19 is utilized with the D/A converter 20 to determine the seven least significant bits. However, the standard configuration D/A converter 60 is unipolar and therefore the common node voltage $V_C$ must be positive before it can be utilized to provide the seven least significant bits That is accomplished as follows.

The necessary switching, if any, to achieve STATE6 for determining MSB5 is actually based on two operations. First, the exclusive OR result A of Equation 1 is utilized solely to determine whether a capacitor is to be removed. If the result A is 0, then there is no change. If the result A is 1, then a capacitor is removed. It should be noted that determining the last MSB, namely MSB5, Equation 1 is utilized differently than for determining the prior MSB's. The difference is that for MSB5, a result A of 0 calls for no change.

The second operation is based on the following observations. It has been determined that the polarity of the common node voltage $V_C$ would be the same as it was in STATE1 if STATE6 were determined solely with reference to Equation 1. That is, if the common node voltage $V_C$ is negative in STATE1 (i.e., $V_A$ is positive and MSB1 is 0), then $V_C$ would be slightly negative if STATE6 were determined solely with reference to Equation 1. If the common node voltage $V_C$ is positive in STATE1 (i.e., $V_A$ is negative and MSB1 is 1), then $V_C$ would be slightly positive if STATE6 were determined solely with reference to Equation 1. Accordingly, the second operation for determining STATE6 is adding an extra capacitor if $V_A$ is positive (i.e., MSB1 is 0). If $V_A$ is negative (i.e., MSB1 is 1), no extra capacitor is added.

In FIG. 3, the extra capacitor is shown in brackets to indicate that it is added only if $V_A$ is positive (MSB1 is 0). The logic for adding an extra capacitor can readily utilize the value for MSB1. Briefly, STATE6 is determined with reference to the exclusive OR result A of Equation 1 (0=no change, 1=remove) and with reference to MSB1 (0=add, 1=no change).

In the foregoing example, in STATE5 the exclusive OR result A is a 0, which indicates no change. However, the analog input $V_A$ was positive and as a result the common node voltage $V_C$ was negative in STATE1 and MSB1 is 0. Therefore, the capacitor CP12 is added by switching its associated switch SP12 to its alternate position as shown in block 111. This effectively places the capacitor groups in STATE6 so that the seven LSB's can be determined by the D/A converter 60.

After the capacitor groups 20, 30 are placed in STATE6, the switch INTSW is opened to allow determination of the seven least significant bits which shall be identified as MSB6 through MSB12. Pursuant to known techniques, MSB6 through MSB12 are serially determined by sequentially switching the capacitors C7 through C1 to drive the common node voltage $V_C$ toward ground. As mentioned previously, the CMPOUT output of the voltage comparator 21 is complemented by the logic and control unit 40 for MSB6 through MSB12.

Figure 5:
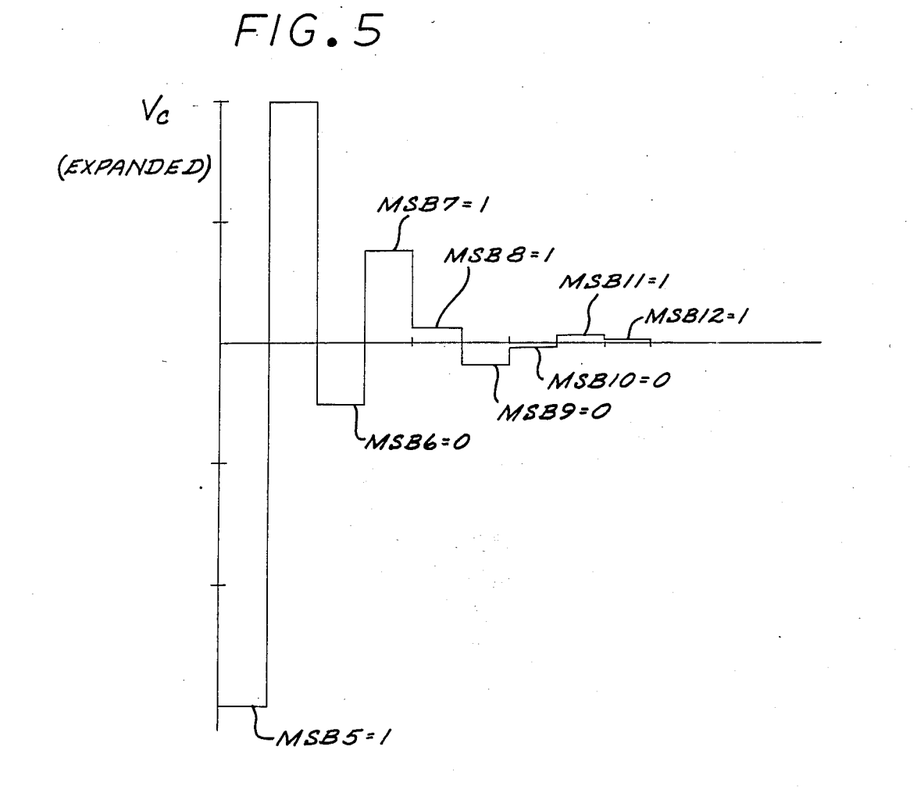
FIG. 5 is a graph illustrating for the example of FIG. 4 the sampled voltage of the A/D converter of FIG. 1 as it changes in response to the switching of binary weighted capacitors for determining the least significant bits.

For the previously discussed example, FIG. 5 shows on an expanded scale the waveform of the common node voltage $V_C$ as MSB6 through MSB12 are determined. The switch S7 is connected to $V_R$, and the common node voltage $V_C$ becomes negative. MSB6 is therefore 0.

The switch S7 is switched back o ground and the switch S6 is connected to $V_R$. The common node voltage $V_C$ becomes positive and therefore MSB7 is 1. The switch S6 remains connected to $V_R$, and the switch S5 is connected to $V_R$. The common node voltage $V_C$ remains positive and therefore MSB8 is 1.

The switches S6 and S5 remain connected to $V_R$, and the switch S4 is switched to $V_R$. The common node voltage $V_C$ becomes negative and therefore MSB9 is 0.

Since the common node voltage $V_C$ is negative, the switch S4 is switched back to ground, and the switch S3 is switched to $V_R$ while the switches S6 and S5 remain connected to $V_R$. The common node voltage $V_C$ remains negative, and therefore MSB10 is 0.

The switch S3 is switched back to ground, and the switch S2 is switched to $V_R$ while the switches S6 and S5 remain connected to $V_R$. The common node voltage $V_C$ becomes positive and therefore MSB11 is 1.

The switches S6, S5, and S2 remain connected to $V_R$, and the switch S1 is switched to $V_R$. The common node voltage $V_C$ remains positive and therefore MSB12 is 1.

From the foregoing, it should be evident that as to the seven least significant bits (i.e., MSB6 through MSB12) capacitance is removed when the common node voltage $V_C$ is negative, while capacitance is added when the common node voltage $V_C$ is positive.

Although the foregoing has been a description and illustration of specific embodiments of the invention, various modifications and changes thereto can be made by persons skilled in the art without departing from the scope and spirit of the invention as defined by the following claims.

What is claimed is:

1. An analog to digital converter for converting an analog input voltage comprising:
   first variable capacitive means having a plurality of first capacitive elements of substantially equal capacitance which are initially coupled between a sampled voltage indicative of the analog input voltage and a first reference voltage, said first capacitive elements collectively providing a first capacitance between said first reference voltage and said sampled voltage;
   second variable capacitive means having a plurality of second capacitive elements of substantially equal value as said first capacitive elements and which are initially coupled between said sampled voltage and a second reference voltage which is positive relative to said first reference voltage, said second capacitive elements collectively providing a second capacitance between said sampled voltage and said second reference voltage; and
   logic and control means responsive to said sampled voltage for incrementally driving said sampled voltage toward said first reference voltage by sequentially changing said first and second capacitances in equal but opposite directions as a function of the polarity of said sampled voltage and for providing an output bit pursuant to each successive state of said first and second capacitances.

2. The analog to digital converter of claim 1 wherein said first variable capacitive means includes first switching means responsive to said logic and control means for selectively switching individual ones of said first capacitive elements from said first reference voltage to said second reference voltage, and wherein said second variable capacitive means includes second switching means responsive to said logic and control means for selectively switching individual ones of said second capacitive elements from said second reference voltage to said first reference voltage.

3. The analog to digital converter of claim 2 wherein said first reference voltage is ground and wherein said second reference voltage is a positive voltage.

4. The analog to digital converter of claim 3 wherein selected ones of said first capacitive elements are switched when the analog input voltage is positive, and wherein selected ones of said second capacitive elements are switched when the analog input voltage is negative.

5. An analog to digital converter for converting an analog input voltage comprising:
   capacitive means havin $2^N$ capacitors of substantially equal value having respective first terminals coupled to a sampled voltage indicative of the analog input voltage and further having respective second terminals individually switchable for connection to either a first reference voltage or to a second reference voltage, where N is the number of most significant bits to be determined with said capacitive means;

switching means for controlling the connections of said respective second terminals to provide a first capacitance between said sampled voltage and said first reference voltage, and to provide a second capacitance between said sampled voltage and said second reference voltage; and controlling means responsive to said sampled voltage for controlling said switching means to sequentially change said first and second capacitances to incrementally drive said sampled voltage toward said first reference voltage and for providing an output bit pursuant to each successive state of said first and second capacitances.

6. The analog to digital converter of claim 5 wherein said switching means connects a first group of $2^{N-1}$ capacitors to said first reference voltage and a second group of $2^{N-1}$ capacitors to said second reference voltage at the beginning of a conversion cycle.

7. The analog to digital converter of claim 6 wherein for a given conversion cycle only capacitors from one of said first or second groups of $2^{N-1}$ capacitors are selectively switched.

8. The analog to digital converter of claim 7 wherein said selectively switched capacitors are switched in a sequence wherein capacitors to be switched from their initial state are selected from capacitors most recently switched back to their initial state, if any, and wherein capacitors to switched back to their initial state are selected from capacitors most recently switched from their initial state.

9. The analog to digital converter of claim 8 wherein said selectively switched capacitors are switched in a sequence of subgroups having $2^{N-I}$ capacitors where I represents the $I^{th}$ most significant bit and is equal to 2 through N.

10. A method for converting an analog input signal to a digital signal having N most significant bits comprising the steps of:

coupling the first terminals of $2^N$ capacitors of substantially equal value to a common node, and switchably coupling respective second terminals of such capacitors to either a first reference voltage node or a second reference voltage node;

sampling the analog input voltage to provide a voltage on the common node indicative of the sampled analog input voltage;

controlling the connections of respective second terminals of the capacitors to provide a first capacitance between the common node and the first reference voltage node, and to provide a second capacitance between the common node and the second reference voltage node; and sequentially changing the first and second capacitances to incrementally drive the voltages of the common node toward said first reference and to provide an output bit pursuant to each successive state of the first and second capacitances.

11. The method of claim 10 wherein said controlling step includes the step of connecting a first group of $2^{N-1}$ capacitors to the first reference voltage node and connecting a second group of $2^{N-1}$ capacitors to the second reference voltage node at the beginning of a conversion 12. The method of claim 11 wherein the step of sequentially changing the first and second capacitances includes the step of selectively switching capacitors of only one of the first and second groups for a given conversion cycle.

13. The method of claim 12 wherein the step of selectively switching capacitors includes the steps of selecting capacitors to be switched from their initial state from capacitors most recently switched back to their initial state, if any, and selecting capacitors to be switched back to their initial state from capacitors most recently switched from their initial state.

14. The method of claim 13 wherein said step of selectively switching capacitors includes the step of switching capacitors in a sequence of subgroups having $2^{N-I}$ capacitors wherein I represents the $I^{th}$ most significant bit and is equal to 2 through N.

* * * * *

UNITED STATES PATENT AND TRADEMARK OFFICE
CERTIFICATE OF CORRECTION

PATENT NO.   : 4,668,936
DATED        : May 26, 1987
INVENTOR(S)  : Newcomb et al.

It is certified that error appears in the above-identified patent and that said Letters Patent is hereby corrected as shown below:

Column 7, line 22:   In formula, "$2^{N-1}$" should be -- $2^{N-I}$ --.

Column 8, line 22:   Insert "namely" before "CP11 and CP12" --namely CP11 and CP12,--.

Column 8, line 24:   "VC" should be --$V_C$--.

Column 8, line 65:   Insert "for" in phrase --that for determining--.

Column 9, line 51:   "o" should be --to--.

Column 12, line 25:  "conversion" should be --conversion cycle.-- (add word "cycle" and period).

Signed and Sealed this

Third Day of October, 1989

Attest:

DONALD J. QUIGG

Attesting Officer

Commissioner of Patents and Trademarks